(12) United States Patent
Zhou et al.

(10) Patent No.: US 10,802,102 B2
(45) Date of Patent: Oct. 13, 2020

(54) PULSED ELECTRON PARAMAGNETIC RESONANCE SPECTROMETER

(71) Applicant: UNIVERSITY OF SCIENCE AND TECHNOLOGY OF CHINA, Anhui (CN)

(72) Inventors: Zongquan Zhou, Anhui (CN); Peiyun Li, Anhui (CN); Chao Liu, Anhui (CN); Xiao Liu, Anhui (CN); Chuanfeng Li, Anhui (CN); Guangcan Guo, Anhui (CN)

(73) Assignee: University of Science and Technology of China, Anhui (CN)

( * ) Notice: Subject to any disclaimer, the term of this patent is extended or adjusted under 35 U.S.C. 154(b) by 0 days.

(21) Appl. No.: 16/331,457

(22) PCT Filed: Mar. 8, 2018

(86) PCT No.: PCT/CN2018/078392
§ 371 (c)(1),
(2) Date: Mar. 7, 2019

(87) PCT Pub. No.: WO2019/029161
PCT Pub. Date: Feb. 14, 2019

(65) Prior Publication Data
US 2020/0182955 A1    Jun. 11, 2020

(30) Foreign Application Priority Data

Aug. 10, 2017  (WO) ............... PCT/CN2017/096819

(51) Int. Cl.
*G01R 33/60*    (2006.01)
*G01R 33/31*    (2006.01)

(52) U.S. Cl.
CPC ............ *G01R 33/60* (2013.01); *G01R 33/31* (2013.01)

(58) Field of Classification Search
CPC ....... G01R 33/31; G21K 1/093; A61B 5/0035
See application file for complete search history.

(56) References Cited

U.S. PATENT DOCUMENTS

| 2005/0225328 A1* | 10/2005 | Ardenkjaer-Larsen ...................... G01R 33/282 324/321 |
| 2006/0096301 A1* | 5/2006 | Triebe ................... F25D 19/006 62/6 |
| 2006/0097146 A1* | 5/2006 | Strobel .................... F25B 9/02 250/286 |

FOREIGN PATENT DOCUMENTS

| CN | 1484510 | 3/2004 |
| CN | 101833072 | 9/2010 |

(Continued)

OTHER PUBLICATIONS

"All-electric control of donor nuclear spin qubits in silicon;" A. Sigillito, et al., Nature Nanotechnology, Published Aug. 14, 2017, vol. 12 (6 Pages).

(Continued)

*Primary Examiner* — Alvaro E Fortich
(74) *Attorney, Agent, or Firm* — Barnes & Thornburg LLP

(57) ABSTRACT

A pulsed electron paramagnetic resonance spectrometer comprises: a microwave excitation generating unit for generating at least one microwave pulse; a microwave conducting unit comprising a resonant cavity and a microwave transmission line for transmitting microwaves, wherein the microwave transmission line is connected between the microwave excitation generating unit and the resonant cavity, and the resonant cavity is for placing a sample; a cryostat and magnet unit comprising a cryostat that performs ultra-low temperature cooling for the microwave resonant cavity, the microwave transmission line being disposed to pass (Continued)

through the cryostat and connected to the resonant cavity; the cryostat and magnet unit further comprises a magnet that provides a resonance test magnetic field around the sample, the resonant cavity being disposed in a room temperature gap of the magnet. The device of the present disclosure characteristics in ultra-low sample temperature (0.1 Kelvin) and is fully functional and easy to operate.

13 Claims, 4 Drawing Sheets

(56) References Cited

FOREIGN PATENT DOCUMENTS

| CN | 202305778 | 7/2012 |
|----|-----------|--------|
| CN | 103529407 | 1/2014 |
| CN | 106597332 | 4/2017 |
| JP | H10160811 | 6/1998 |
| JP | 3860840   | 9/2000 |
| JP | 3338381   | 10/2002 |
| JP | 2013024554 | 2/2013 |
| JP | 2015102409 | 6/2016 |

OTHER PUBLICATIONS

"A sub-Kelvin cryogen-free EPR system;" S. Melhuish, et al., Journal of Magnetic Resonance, Published Jul. 20, 2017 (6 Pages).
International Search Report; International Application No. PCT/CN2018/078392, dated May 30, 2018 (4 Pages).
"A Ku bank pulsed electron paramagnetic resonance spectrometer using an arbitrary waveform generator for quantum control experiments at millikelvin temperatures," Yung Szen Yap, et al., Rev. Sci, Instrum, vol. 86 dated Jun. 24, 2015 (8 pages).
Office Action dated Mar. 17, 2020 for Japanese Application No. 2019-509501 (10 pages).

\* cited by examiner

PULSED ELECTRON PARAMAGNETIC RESONANCE SPECTROMETER

CROSS REFERENCE TO RELATED APPLICATIONS

This application is a U.S. nationalization under 35 U.S.C. § 371 of International Application No. PCT/CN2018/078392, filed Mar. 8, 2018, which claims priority to International Patent Application No. PCT/CN2017/096819, filed Aug. 10, 2017. The disclosures set forth in the referenced applications are incorporated herein by reference in their entireties.

TECHNICAL FIELD

The present disclosure relates to the field of magnetic resonance spectrometers, and more particularly to a pulsed electron paramagnetic resonance spectrometer that can operate at ultra-low temperatures.

BACKGROUND

Electron paramagnetic resonance (EPR) spectrometer is a device for studying unpaired electrons in a substance. Its basic principle is Zeeman effect for unpaired electron spins: a single electron has a spin quantum number of $s=\frac{1}{2}$, so it can be in the spin quantum state of $m_s=+\frac{1}{2}$ or $m_s=-\frac{1}{2}$. When there is an external magnetic field, the energy of these two spin states will be different. The energy level splitting is detected by applying a resonant microwave field in order to obtain internal information of the substance system, including the nuclear species around the electron, the magnetic field environment, the electron spin splitting, and the like.

EPR is a highly sensitive, non-invasive detection method with a wide range of applications in physics, chemistry, biology, medicine, engineering and many other fields. Some typical uses include detection of impurity or defect of materials in engineering and security field, quantitative analysis of specific elements in chemical reactions, tissue imaging in the biological field, quantitative analysis of radiation doses in the medical field, researches on multibody correlation and phase transition in condensed state physics, and quantum computation and quantum storage in quantum information processing.

The standard EPR system mainly includes a microwave source, a microwave pulse modulator and demodulator, a microwave amplifier, a microwave bridge, a sample rod, a three-dimensional microwave resonant cavity and a super-uniform magnet. When the incident microwave of the EPR system is a continuous wave, this continuous wave EPR system can only be used for resonant transition signal detection. The incident microwave of the EPR system can also be set to produce a complex microwave pulse sequence. This pulsed EPR system can have more abundant functions and can be used for other spin dynamics analysis such as spin population lifetime and coherence lifetime. Taking the application of quantum information field as an example, the prior art often requires a pulsed EPR system to realize functions such as spin quantum state manipulation, controlled quantum logic gate, microwave quantum state storage and the like.

At present, the manufacturers that can produce pulsed EPR systems internationally mainly include BRUKER in Germany. Considering EPR analysis of solid materials, in order to freeze the internal electron-phonon interactions of the materials, a low temperature environment is generally required. The lowest sample temperature that can be reached by commercial EPR systems today is approximately 3K. However, this temperature does not meet the demand for extending spin coherence time in the field of quantum information. As a typical example, in recent years, rare earth ions doped crystals have achieved high fidelity storage for a single photon quantum state, and are quantum storage systems with practical potential. The ultimate limitation on its storage time is the coherence time of electron and nuclear spins of the ions. Analysis results of a prior art pulsed EPR system show that with the decrease of temperature, the electron spin and nuclear spin coherence times of the sample increase significantly with the temperature drop. When the temperature reaches the lowest temperature 5K of the system, the electron spin and nuclear spin coherence times of the sample reach the order of 0.1 ms and 1 ms respectively [Phys. Rev. Lett. 114.170503 (2015)]. However, practical quantum memories generally require a storage time in the order of a second. Continued decrease of the sample temperature in this experiment apparently yielded a longer coherence lifetime, however, this group had no way to acquire further data because all commercial EPR systems are currently unable to reach a temperature zone below 3K. There is even a general perception in the international academic community that it is impossible for an EPR system of a three-dimensional resonator to reach a sample temperature below 3K. For example, the literature [Appl. Phys. Lett. 106.193505 (2015)] clearly points this out in the second paragraph of the first page. If a coplanar transmission line type resonant cavity is used, the temperature is easily lowered, but an alternating magnetic field generated by the cavity is only distributed in the range of several tens to hundreds of micrometers near the transmission line, and the magnetic field is drastically attenuated as the distance changes. The sample size is limited and the homogeneity of produced magnetic field is poor.

SUMMARY

In view of this, it is an object of the present disclosure to provide an electron paramagnetic resonance spectrometer having a sample temperature on the order of 0.1 K and having various test functions of a conventional electron paramagnetic resonance spectrometer.

The present disclosure provides a pulsed electron paramagnetic resonance spectrometer comprising:

a microwave excitation generating unit, configured to generate at least one microwave pulse;

a microwave conducting unit, comprising a resonant cavity and a microwave transmission line for transmitting microwaves, the microwave transmission line being connected between the microwave excitation generating unit and the resonant cavity, wherein the resonant cavity is configured to place a sample;

a cryostat and magnet unit, comprising: a cryostat that is configured to perform an ultra-low temperature cooling on the order of 0.1 Kelvin for the resonant cavity, the resonant cavity being disposed in the cryostat, the microwave transmission line being disposed to pass through the cryostat and connected to the resonant cavity; and a magnet that is configured to provide a magnetic resonance test magnetic field to reach the sample, the resonant cavity being disposed in a room temperature gap of the magnet.

In a further embodiment, the microwave conducting unit comprises a sample rod, one end of the sample rod is mounted with the resonant cavity, and the other end is fixed to the cryostat.

In a further embodiment, the cryostat comprises layers of cold plates arranged along a transmission direction of the microwave transmission line, so as to cool the microwave transmission line layer by layer, the microwave transmission line being disposed to pass through the cold plates layer by layer.

In a further embodiment, the resonant cavity is a microwave resonant cavity for microwaves in a plurality of operating bands such as L, S, X bands and electron and nuclear double resonance.

In a further embodiment, the microwave transmission line has a conductive medium of silver plated stainless steel, silver plated CuNi and NbTi superconductor.

In a further embodiment, the cryostat and magnet unit further comprises an electric rail configured to carry and position the magnet.

In a further embodiment, the cryostat has a cylindrical tail end, which has an outer diameter being compatible with the magnet gap, and an inner diameter being compatible with the resonant cavity.

In a further embodiment, the microwave transmission line is provided with a heat sink and a joint at each layer of the cold plates, so as to cool an outer and inner core of the microwave transmission line thoroughly.

In a further embodiment, the sample rod comprises a thermally conductive metallic material.

In a further embodiment, a heat radiation shielding casing is mounted outside each layer of the cold plates.

It can be seen from the technical solutions provided by the present disclosure as described above that a sample temperature on the order of 0.1 K can be obtained by incorporating the EPR system with an ultra-low temperature cryostat and the microwave transmission line, thereby realizing EPR detection in the ultra-low temperature zone. The use of the electric rail can easily realize the docking and assembly operation of the EPR system and the cryostat system; the device used in the above process is easy to operate and has high stability and low sample temperature, and compatible with all functions of the conventional EPR system.

BRIEF DESCRIPTION OF THE DRAWINGS

In order to more clearly illustrate the technical solutions of the embodiments of the present disclosure, the drawings used in the description of the embodiments will be briefly described below. It is obvious that the drawings in the following description are only some embodiments of the present disclosure. For those skilled in the art, other drawings can be obtained according to these drawings without any creative effort.

FIG. 4A and FIG. 4B are diagrams showing the electron spin echo (ESE) and temperature dependence of $Nd^{3+}$ ions in the YSO crystal under the ultra-low temperature zone using the resonance spectrometer shown in FIG. 2 according to an embodiment of the present disclosure, wherein FIG. 4A shows time domain signals of the measured electron spin echoes at different sample temperatures; FIG. 4B shows a relationship between relative magnitudes of the electron spin echoes and the sample temperatures.

DETAILED DESCRIPTION

The technical solutions in the embodiments of the present disclosure are clearly and completely described in the following with reference to the drawings in the embodiments of the present disclosure. It is obvious that the described embodiments are only a part of the embodiments of the present disclosure, and not all of the embodiments. All other embodiments obtained by a person of ordinary skill in the art based on the embodiments of the present disclosure without creative efforts are within the scope of the present disclosure.

"Ultra-low temperature" as used in the present disclosure refers to a temperature on the order of 0.1 K (Kelvin).

As mentioned above, the EPR spectrometer in the ultra-low temperature zone is a major basic instrument urgently needed in the field of quantum information and quantum storage. For example, considering the ultra-low temperature of 0.1K, the population of electron spins in the X-band EPR spectrometer can achieve an initialization level of more than 95%, which directly makes the signal-to-noise ratio of the electron spin echo (that is, the signal-to-noise ratio of the instrument) increase by one to two orders of magnitude compared to the 3K temperature test conditions. The improvement of signal-to-noise ratio is the fundamental indicator of all measuring instruments, so the ultra-low temperature EPR system is expected to have more applications in other fields.

According to a basic idea of the present disclosure, a pulsed electron paramagnetic resonance spectrometer is provided, comprising:

a microwave excitation generating unit that is configured to generate at least one microwave pulse; a microwave conducting unit that includes a resonant cavity and a microwave transmission line that transmits microwaves, the microwave transmission line being connected between the microwave excitation generating unit and the resonant cavity, and the resonant cavity being configured to place a sample; a cryostat and magnet unit that includes a cryostat that is configured to perform an ultra-low temperature cooling for the microwave resonant cavity, the microwave transmission line being disposed to pass through the cryostat and connected to the microwave resonant cavity. The cryostat and magnet unit further includes a magnet configured to provide a magnetic resonance test magnetic field around the sample, the resonant cavity being disposed in a room temperature gap of the magnet. It may also include a microwave detecting unit that is configured to collect and analyze microwaves emitted by the microwave conducting unit. With the above arrangement, the EPR system can be incorporated with the cryostat, so as to obtain an ultra-low sample temperature on the order of 0.1 K.

Figure 1:
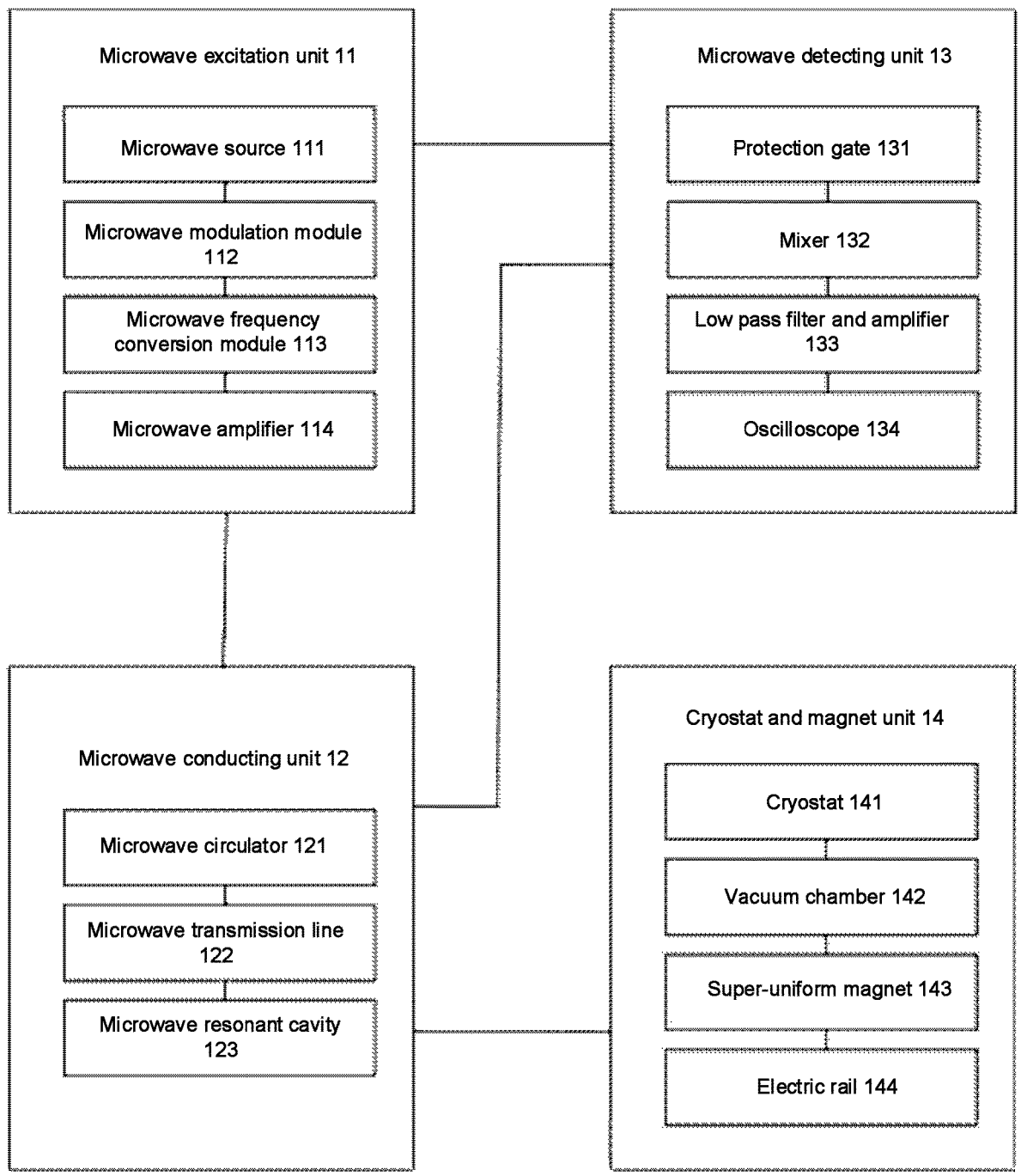
FIG. 1 is a block diagram of a pulsed electron paramagnetic resonance spectrometer according to an embodiment of the present disclosure.

FIG. 1 is a schematic diagram of a system framework according to a first embodiment of the present disclosure. As shown in FIG. 1, the device mainly includes:

a microwave excitation generating unit 11, a microwave conducting unit 12, a microwave detecting unit 13, and a cryostat and magnet unit 14.

The microwave excitation generating unit 11 is configured to generate various high-energy microwave pulses.

The microwave conducting unit 12 is configured for directional transmission of microwave pulses, mounting samples and realizing microwave emission and collection.

The microwave detecting unit 13 is configured to collect and analyze microwave signals.

The microwave excitation generating unit 11, the microwave conducting unit 12 and the microwave detecting unit 13 are provided with complete test functions such as field-swept electron paramagnetic resonance detection, electron spin echo, electron and nuclear double resonance.

The cryostat and magnet unit 14 is configured to perform the ultra-low temperature cooling for the microwave resonant cavity and provide a high homogeneous magnetic field to achieve magnetic resonance test conditions.

Further, the microwave excitation generating unit 11 includes: a microwave source 111, a microwave modulation module 112, a microwave frequency conversion module 113, and a microwave amplifier 114.

The microwave source 111 is configured to generate a single-frequency microwave signal of a specific frequency.

The microwave modulation module 112 is configured to generate microwave pulses with various amplitudes, phases, and frequencies from single-frequency continuous microwaves.

The microwave frequency conversion module 113 is configured to expand the test frequency band of the microwave.

The microwave amplifier 114 is configured to perform amplification on the microwave pulse to achieve a high energy pulse required for the pulsed EPR.

Further, the microwave conducting unit 12 includes: a microwave circulator 121, a microwave transmission line 122, and a microwave resonant cavity 123.

The microwave circulator 121 is configured for directional transmission of microwaves, guiding the microwave of the microwave excitation unit 11 into the sample, and guiding a sample signal into the microwave detecting unit 13.

The microwave transmission line 122 is configured for microwave conduction between the microwave circulator 121 and the microwave resonant cavity 123; unlike conventional microwave transmission cables, considering the ultra-low temperature cooling requirement of the device, a selection for the material of the microwave transmission line should take account of conductive and thermal insulation requirements, and typical conductive medium may be silver plated stainless steels, silver plated CuNi and NbTi superconductors.

The microwave resonant cavity 123 is configured to mount a sample and realize the emission and collection of microwaves. The microwave resonant cavity 123 in the present disclosure is a three-dimensional resonant cavity, and the three-dimensional resonant cavity may generate a uniformly distributed alternating magnetic field, which may be used to test large-sized samples, enabling to have more abundant testing functions.

Further, the orbital microwave detecting unit 13 includes: a protection gate 131, a mixer 132, a low pass filter and amplifier 133, and an oscilloscope 134.

The protection gate 131 is configured to turn off the detection system when the high-energy microwave pulse is incident; and to turn on the detection system when performing signal detection.

The mixer 132 is configured to mix the microwave signal collected from the microwave conduction module and a local oscillator microwave and output a mixed signal; the local oscillator microwave is from the microwave excitation generating unit 11.

The low-pass filter and amplifier 133 is configured to perform low-pass filtering and amplification on the mixed signal output by the mixer 132, so as to implement pulse demodulation; and to amplify the demodulated pulse signal.

The oscilloscope 134 is configured to store and display signals.

Further, the cryostat unit 14 includes: a cryostat 141, a vacuum chamber 142, a super-uniform magnet 143, and an electric rail 144.

The cryostat 141 is configured to provide a cooling capacity and cool a target system; the temperature of the sample of the instrument may reach an order of 0.1 K by the cryostat.

The vacuum chamber 142 is configured to mount the microwave transmission line 122 and the microwave resonant cavity 123, and isolate external heat radiation.

The super-uniform magnet 143 is configured to generate a high-uniformity and high-stability magnetic field; it may be a room temperature electromagnet or a superconducting magnet.

The electric rail 144 is configured to carry and position the magnet when performing sample replacement; the electric rail has a jack, which is operated up and down for carrying and positioning the magnet, and has a horizontal stroke exceeding the outer dimension of the magnet.

The embodiments of the present disclosure incorporate a cryostat with a conventional EPR system to achieve ultra-low temperature EPR testing and contribute to significantly improve the signal-to-noise ratio of the test. The apparatus used in the above process is easy to operate, and the system has high stability and perfect testing functions.

In order to further introduce the present disclosure, the embodiments of the present disclosure will recite specific numerical values, and the component parameters in the device will be described. It should be noted that the enumerated component parameter values are only for facilitating understanding of the disclosure, and are not for limiting. In actual application, the user may use components with different parameters according to the needs or experience.

Figure 2:
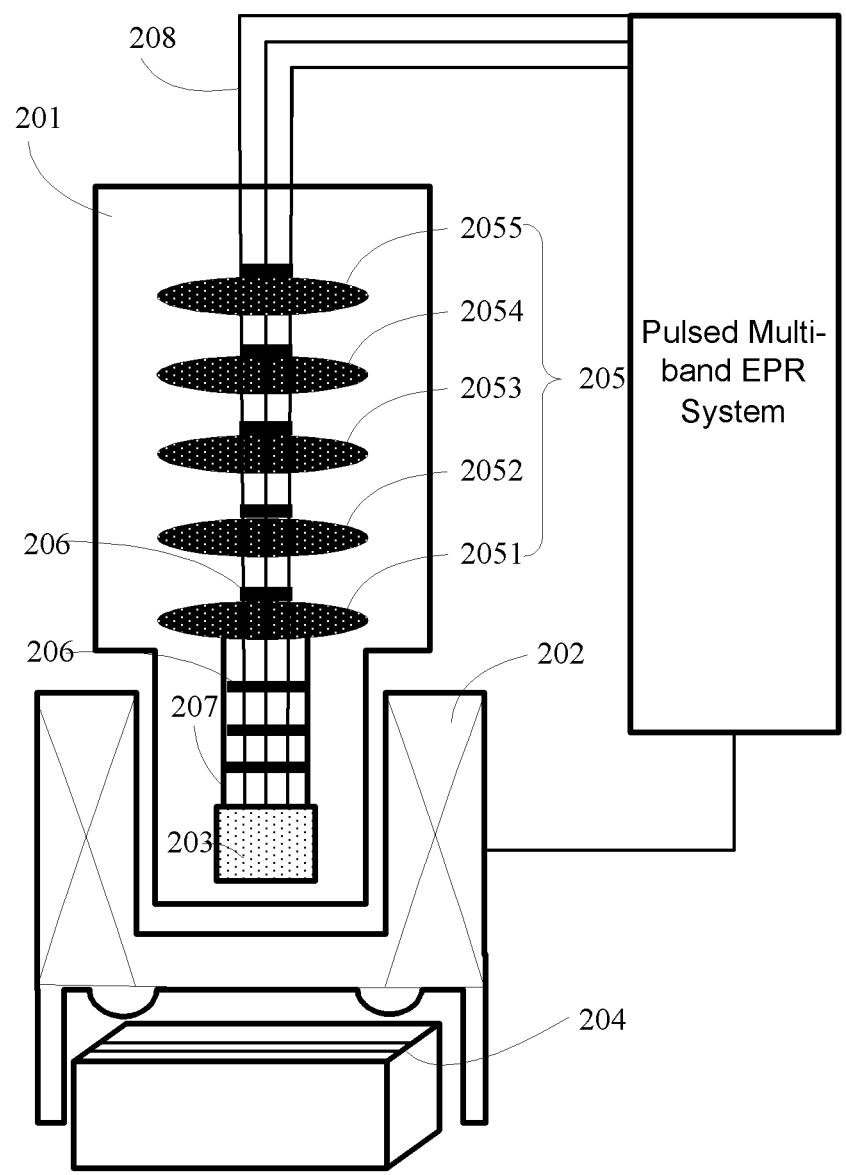
FIG. 2 is a schematic partial assembly diagram of a pulsed electron paramagnetic resonance spectrometer according to an embodiment of the present disclosure.

The various modules in FIG. 1 may be purchased separately and assembled, or a multi-module assembled subsystem may be provided from the prior art. Based on such a subsystem, a pulsed electron paramagnetic resonance spectrometer may be easily constructed. For example, a commercial EPR spectrometer may provide a microwave excitation unit, a circulator and a microwave cavity in the microwave conduction unit, a microwave detection unit, and a super-uniform magnet in the cryostat and magnet unit. FIG. 2 is a schematic system assembly diagram of an EPR spectrometer according to an embodiment of the present disclosure. A multi-layer radiation shielding casing in a low temperature chamber and a matching compressor unit in the low temperature chamber are omitted in the figure, which only shows some important details of the system docking.

It mainly includes:

1) Pulsed multi-band EPR system (the EPR system here includes a microwave excitation generating unit, a microwave circulator and a microwave resonant cavity in the microwave conducting unit, a microwave detecting unit, and a magnet in the cryostat and magnet unit)

It mainly includes: an L/S/X band microwave bridge, an L/S/X band microwave amplifier, a microwave modulator based on any waveform generator, an US/X band microwave resonant cavity, an X-band microwave detection system, an electronic and nuclear double resonance (ENDOR) module and a super-uniform magnet.

In the present embodiment, the X-band microwave bridge may have a frequency range of 9.0 to 10.0 GHz. The L/S band microwave bridge mainly realizes the function of frequency conversion, and it realizes the signal frequency conversion of X-band and L/S band based on the mixer with fixed local oscillator frequency. The frequency band expansion achieved in this way of frequency conversion is the most economical way, wherein multiple bands may share the X-band microwave detection module. The microwave circulator has been built in microwave bridges of the three bands to realize directional transmission of microwaves.

In the present embodiment, the X-band microwave amplifier is a 300 W solid-state amplifier, and the L/S band amplifier has an output power of about 100 W.

In the present embodiment, the microwave modulator based on any waveform generator may has a sampling rate of 5 GS/s, a modulation bandwidth of 500 MHz, and can perform any waveform modulation on frequency, phase, and amplitude.

In the present embodiment, the parameters of the L/S/X-band microwave resonant cavity may be as follows: an effective aperture inside the resonant cavity of each band being 5 mm, an outer diameter being 20 mm, and an SMB or MMCX type quick connector being used, to realize a convenient band conversion. The resonant cavity for each band may have a Q value of about 50 to 500, and the required Q value is determined according to a specific experiment.

In the present embodiment, the coil type super-uniform superconducting magnet may have a magnetic field uniformity of 10 ppm @ 40 mm DSV, a maximum field strength of 1.8 T, and an air gap of 100 mm.

2) Dilution cryostat system (since this part is a main improvement point of the embodiments of the present disclosure, therefore, it is illustrated separately, which corresponds to the cryostat in FIG. 1)

In the present embodiment, the cryostat may be a dilution cryostat without liquid helium consumption, which has a minimum temperature of 10 mK, a cooling power of 400 uW at 100 mK, and a cooling power of 1 W at 4K.

In the present embodiment, preferably, the cryostat cavity 201 may include: 50K cold plate 2055, 3K cold plate 2054, 1K cold plate 2053, 100 mK cold plate 2052, and 10 mK cold plate 2051. Among them, 50K cold plate 2055, 3K cold plate 2054 and 1K cold plate 2053 are required to be equipped with a matching heat radiation shielding casing (not shown). The outer diameter of the tail of the cryostat is 95 mm, and the diameter of the sample space in the tail is 40 mm.

The cryostat system is inserted into the magnet air gap of the electron paramagnetic resonance system from above.

3) Special System Connection

It mainly includes a sample rod 207 and a microwave transmission line 208.

In the present embodiment, the resonant cavity 203 is mounted on one end of the sample rod 207 of a thermally conductive metallic material, and the other end of the sample rod 207 is fixed to a lowest temperature cold plate 2051 of 10 mK, but not connected to other cold plates (2052, 2053, 2054, and 2055). In the present embodiment, the microwave transmission line may be a semi-rigid coaxial transmission line, which may have the outer diameter of 3.5 mm and whose outer and inner core may be materials which are not readily to conduct heat but readily to conduct electricity, such as silver-plated stainless steels, superconducting materials, etc.

To further enhance the cooling effect, a plurality of heat sinks 206 may be disposed on the microwave transmission line 208.

4) Electric Rail 204

In the present embodiment, the electric rail 204 may have a load capacity of more than 3 tons, a working stroke of 1.5 meters, and a positioning accuracy of 0.1 mm. The size of a working panel of the rail is 550 mm*550 mm.

In the magnet 202 of the present embodiment, the height of the legs on both sides may be 230 mm, and the distance between the legs on both sides is 600 mm. The rail is equipped with a jack having a height stroke of 20 mm, so as to support or position the magnet. After the jack of the rail is raised, a total height of the working panel with respect to the ground is 240 mm. At this time, the rail working panel directly supports the magnet 202 and performs the carrying and positioning. After the jack of the rail is dropped, the magnet 202 is separated from the rail surface and directly supported on the ground.

In the figure, the tail end of the cryostat is cylindrical, the outer diameter is compatible with the gap of the magnet, and the inner diameter of the tail end of the cryostat is compatible with the resonant cavity.

In the present embodiment, in order to optimize the system cooling process and measure the temperature performance of the actual system, a temperature calibration based on spin polarization measurements and a calibrated thermometer may be used to measure the actual operating temperature of the system and the sample.

When an S-band microwave resonant cavity is installed in the system, a calibrated $RuO_2$ resistance thermometer is installed in the cavity. As the temperature decreases, the resistance value gradually increases. The results show that the lowest temperature is below 10 mK under the condition that no actual test sample is placed in the resonant cavity.

Figure 3:
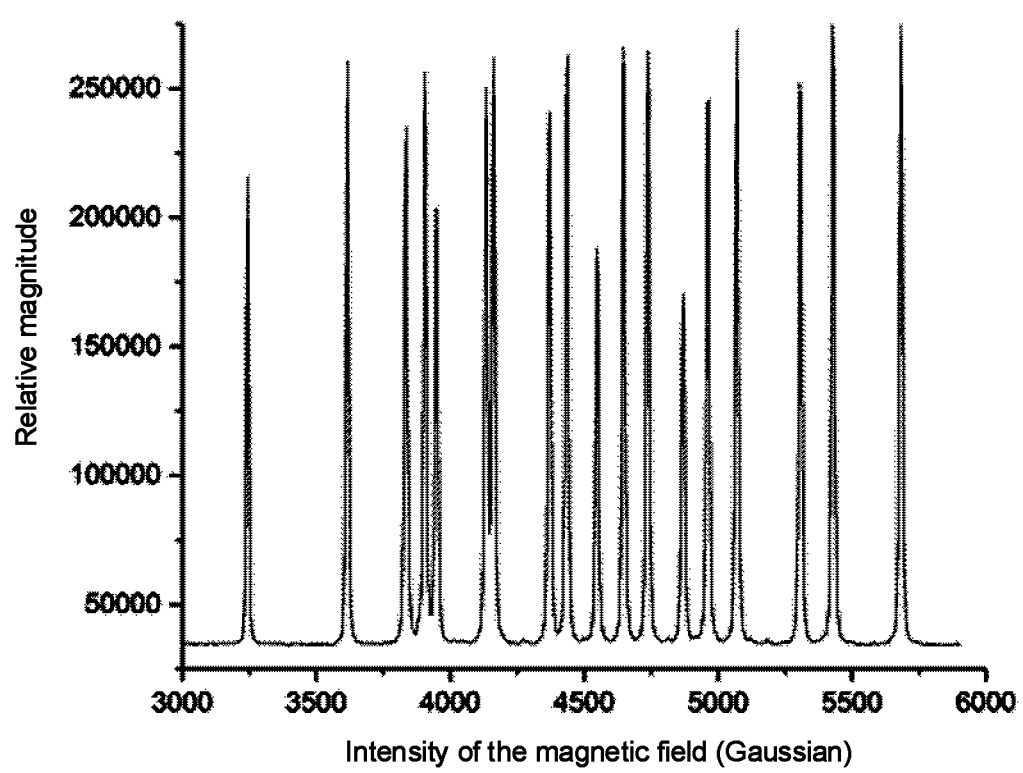
FIG. 3 is a schematic diagram of a field-swept electron spin echo (FSESE) of Nd3+ ions in a yttrium silicate (YSO) crystal at a temperature of 6.5 K using the resonance spectrometer shown in FIG. 2 according to an embodiment of the present disclosure.

Further, in the present embodiment, the spin-polarization level of the rare earth ions may be used to accurately determine the actual operating temperature of the sample. An X-band ENDOR resonant cavity is installed in the system. The cavity is filled with a 20 ppm-concentration $^{143}Nd$ isotope-doped YSO crystal. The crystal also contains about 1 ppm of isotopes of even-numbered nucleon (including $^{142}Nd$, $^{146}Nd$, $^{148}Nd$). The external test magnetic field is parallel to D1 axis of the crystal. FIG. 3 shows a test result of the field-swept electron spin echo at a temperature of 6.5K, which includes 16 spectral lines of $^{143}Nd$ and 2 spectral lines of Nd isotopes of even-numbered nucleons.

Figure 4A:
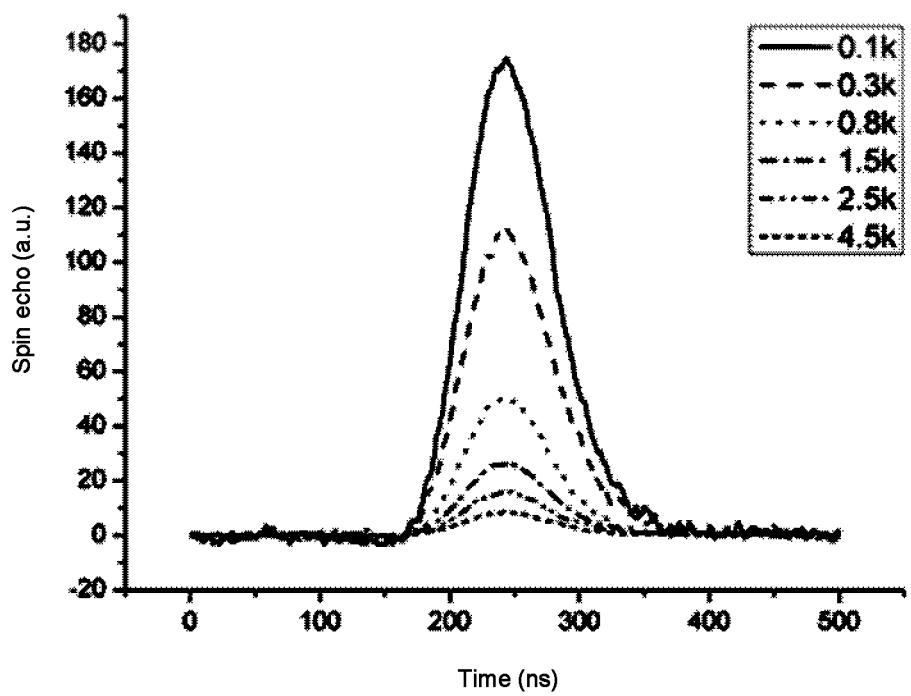

FIG. 4A shows spin echo signals obtained when changing different cold plate temperatures under a 4581G magnetic field. The magnetic resonance signals acquired under the test magnetic field are derived from Nd isotopes of even-numbered nucleons. The length of spin evolution time selected in the experiment was 2 us, which is much shorter than electron spin coherence lifetimes (20 us~200 us) at all test temperatures.

Nd isotopes of even-numbered nucleons have an electron spin of ½ and a nuclear spin of zero, which are a simple two-level system under magnetic field. The relative magnitude of the spin echo thereof is proportional to a difference in the population of the target transition. According to the Boltzmann distribution, the difference in the two-level population at different temperatures may be strictly calculated:

$$\Delta n = \frac{1 - \mathrm{Exp}[-h*v/k*T]}{1 + \mathrm{Exp}[-h*v/k*T]}$$

Where h is the Planck constant, v=9.56 GHz is the microwave frequency, h*v is the energy of the resonant microwave photon, k is the Boltzmann constant, and T is the sample temperature. When T approaches absolute zero, the spin echo size reaches a relative maximum of 1.

Figure 4B:
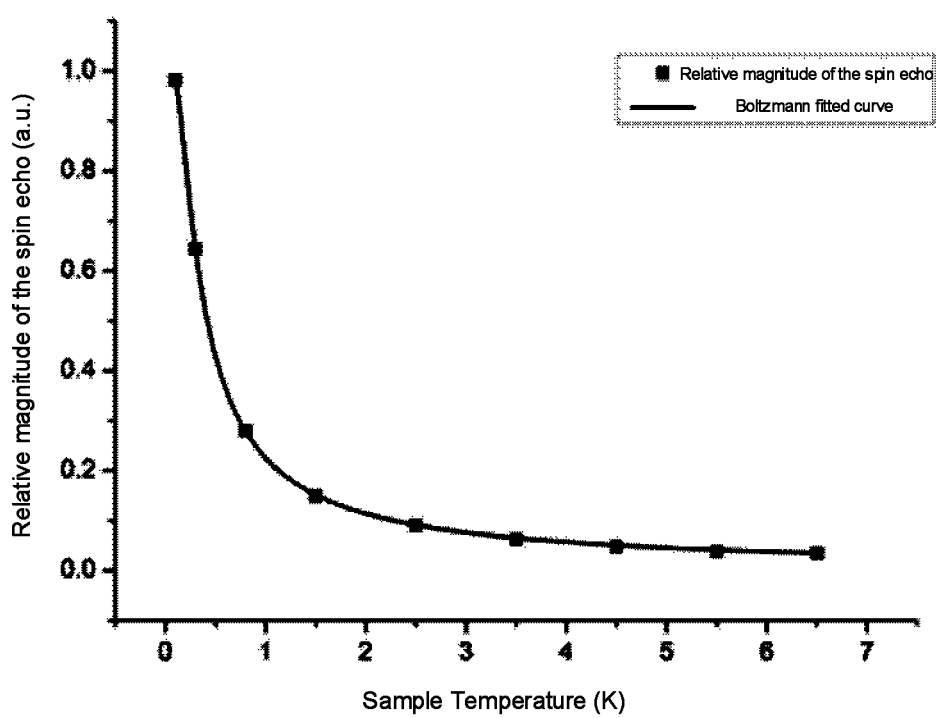

FIG. 4B shows that as the cold plate temperature decreases, the spin echo signal from the sample increases gradually. The signal-to-noise ratio of the device at a 0.1K operating temperature may be increased by more than 20 times compared to a commercial instrument at a 4.5K operating temperature. The experimental result strictly follows the spin polarization level predicted by the Boltzmann distribution, so it is rigorously proven that the sample operating temperature reaches 0.1 K.

In the embodiments of the present disclosure, an original pulsed electron paramagnetic resonance spectrometer is developed, and the thermometer shows that the sample chamber has a no-load temperature of less than 10 mK. Based on the device, the ultra-low temperature spin echo test of $Nd^{3+}$ ions in YSO crystal is completed. It is calibrated according to the size of the spin echo signal that the actual operating temperature of the sample may reach 0.1 K. This is the three-dimensional resonant cavity pulsed electron paramagnetic resonance spectrometer that reports the lowest temperature in the world. Its various components are general-purpose electrical devices, and the device is stable and fully functional, and has broad application prospects.

It will be clearly understood by those skilled in the art that, for the convenience and brevity of the description, only the division of each functional module described above is exemplified. In practical applications, the above function assignment may be completed by different functional modules as needed. The internal structure of the device is divided into different functional modules to perform all or part of the functions described above.

The purpose, technical solutions and beneficial effects of the present disclosure have been further described in detail in the specific embodiments of the present invention as described above. It should be understood that the above description is only specific embodiments of the present disclosure, and is not intended to limit the disclosure. Any modification, equivalent substitution, improvement, etc., made within the spirit and principle of the present disclosure is intended to be included within the scope of the present disclosure.

We claim:

1. A pulsed electron paramagnetic resonance spectrometer comprising:
   a microwave excitation generating unit, configured to generate at least one microwave pulse;
   a microwave conducting unit, comprising a resonant cavity and a microwave transmission line for transmitting microwaves, the microwave transmission line being connected between the microwave excitation generating unit and the resonant cavity, wherein the resonant cavity is configured to place a sample;
   a cryostat and magnet unit, comprising: a cryostat that is configured to perform an ultra-low temperature cooling on the order of 0.1 Kelvin for the sample, the resonant cavity being disposed in the cryostat, the microwave transmission line being disposed to pass through the cryostat and connected to the resonant cavity; and a magnet that is configured to provide a magnetic resonance test magnetic field to reach the sample, the resonant cavity being disposed in a room temperature gap of the magnet.

2. The pulsed electron paramagnetic resonance spectrometer of claim 1, wherein the microwave conducting unit comprises a sample rod made of copper gold-plated material, one end of the sample rod is mounted with the resonant cavity, and the other end is fixed to a cold plate.

3. The pulsed electron paramagnetic resonance spectrometer of claim 1, wherein the cryostat comprises layers of cold plates arranged along a transmission direction of the microwave transmission line to cool the microwave transmission line step by step, the microwave transmission line being disposed to pass through the cold plates layer by layer piecewise.

4. The pulsed electron paramagnetic resonance spectrometer of claim 1, wherein the resonant cavity is a three-dimensional resonant cavity with Q value of 50-500, wherein a RF coil is wound outside the resonant cavity, and the resonant cavity is configured to support electron and electron double resonance tests, including MW operating bands of L, S X and Q bands.

5. The pulsed electron paramagnetic resonance spectrometer of claim 3, wherein the microwave transmission line has a conductive medium of silver plated stainless steel or silver plated CuNi material between a room temperature interface and a 3K cold plate, and a conductive medium of NbTi superconductor material between the 3K cold plate and the resonant cavity.

6. The pulsed electron paramagnetic resonance spectrometer of claim 1, wherein the cryostat and magnet unit further comprises:
   an electric rail composed of a one-dimensional mobile platform and a one-dimensional rotating platform, and configured to carry, position and rotate the magnet.

7. The pulsed electron paramagnetic resonance spectrometer of claim 1, wherein the cryostat has a cylindrical tail end, which has an outer diameter being compatible with the magnet gap, and an inner diameter being compatible with the resonant cavity.

8. The pulsed electron paramagnetic resonance spectrometer of claim 5, wherein the microwave transmission line is provided with a heat sink and a joint at each layer of the cold plates, so as to cool an outer and inner core of the microwave transmission line thoroughly.

9. The pulsed electron paramagnetic resonance spectrometer of claim 3, wherein a heat radiation shielding casing is mounted outside each layer of the cold plates, and the temperature of the innermost shielding casing is lower than 1K, so as to avoid a temperature rise of the sample to be tested which is induced by the heat radiation.

10. The pulsed electron paramagnetic resonance spectrometer of claim 2, wherein the microwave conducting unit comprises a sample rod, one end of the sample rod is mounted with the resonant cavity, and the other end is fixed to a cold plate having the lowest temperature in the cryostat.

11. The pulsed electron paramagnetic resonance spectrometer of claim 4, wherein the sample to be tested is pushed tightly inside the resonant cavity by using high-purity silicon rod, silicon carbide or diamond, to achieve heat conduction at an ultra-low temperature; the top and the housing of the resonant cavity are made of copper gold-plated material, and are closely connected with the sample rod, so as to achieve a sufficient heat conduction.

12. The pulsed electron paramagnetic resonance spectrometer of claim 4, wherein the resonant cavity is placed in a vacuum environment and only conduct the heat with the cold plate having the lowest temperature in the cryostat.

13. The pulsed electron paramagnetic resonance spectrometer of claim 1, wherein a plurality of microwave and RF switches are installed in microwave and RF signal transmission lines of the system, and wherein the switches are switched off when no signal is loaded, so as to prevent an electric signal of system noise from heating the sample to be tested.

* * * * *